United States Patent
Kim et al.

(10) Patent No.: US 11,101,228 B1
(45) Date of Patent: Aug. 24, 2021

(54) INTEGRATED CIRCUIT PACKAGE WITH A MAGNETIC CORE

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/789,863

(22) Filed: Feb. 13, 2020

(51) Int. Cl.
*H01L 23/00* (2006.01)
(52) U.S. Cl.
CPC .............. *H01L 24/03* (2013.01); *H01L 24/04* (2013.01); *H01L 2924/01013* (2013.01); *H01L 2924/01029* (2013.01); *H01L 2924/14* (2013.01)
(58) Field of Classification Search
CPC ..................... H01L 24/03; H01L 24/04; H01L 2924/01013; H01L 2924/01029; H01L 2924/14; H01L 2924/00; H01L 23/645; H01L 21/823871
See application file for complete search history.

(56) References Cited

U.S. PATENT DOCUMENTS

| | | | |
|---|---|---|---|
| 2015/0302974 A1* | 10/2015 | Zhao | H05K 1/181 361/270 |
| 2017/0250134 A1* | 8/2017 | Sturcken | H01F 41/0206 |
| 2018/0138126 A1* | 5/2018 | Chen | H01L 24/20 |
| 2020/0066830 A1* | 2/2020 | Bharath | H01L 23/5227 |
| 2020/0105653 A1* | 4/2020 | Elsherbini | H01L 23/642 |
| 2020/0135677 A1* | 4/2020 | Chang | H01L 23/147 |
| 2020/0402847 A1* | 12/2020 | Chen | H01L 24/03 |
| 2020/0403617 A1* | 12/2020 | Lee | H03K 19/1776 |

* cited by examiner

*Primary Examiner* — Douglas W Owens
(74) *Attorney, Agent, or Firm* — Patterson & Sheridan, L.L.P.

(57) ABSTRACT

Aspects of the present disclosure provide an integrated circuit package having an inductive element with a magnetic core. An example integrated circuit package generally includes a semiconductor die, a redistribution layer, and a magnetic core. The semiconductor die includes a metal layer having first conductive traces and conductive pillars coupled to and extending from the metal layer. The redistribution layer is disposed below the semiconductor die and includes second conductive traces. A portion of the first conductive traces, a portion of the conductive pillars, and a portion of the second conductive traces are arranged to form an inductive element disposed below a portion of the semiconductor die. The magnetic core is disposed in the inductive element.

20 Claims, 8 Drawing Sheets

INTEGRATED CIRCUIT PACKAGE WITH A MAGNETIC CORE

BACKGROUND

Field of the Disclosure

Certain aspects of the present disclosure generally relate to electronic circuits and, more particularly, to an integrated circuit package having an inductive element with a magnetic core.

Description of Related Art

Integrated circuits (IC) are often powered using various power supply circuits such as a power supply that provides a constant output voltage or a switched-mode power supply (SMPS) that provides a variable voltage. The variable voltage output by the SMPS may facilitate efficient operation of an IC in terms of power consumption. The voltage may be adjusted using various techniques including average power tracking (APT), continuous envelope tracking (CET), or discrete envelope tracking (DET).

In certain cases, a wireless communication device may include a radio frequency transceiver (also referred to as a radio frequency front-end) for transmitting and/or receiving RF signals. On the transmit side, the RF transceiver may include an SMPS that supplies power to a power amplifier for transmitting the RF signals. Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., Wi-Fi), and the like.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include an improved integrated circuit package having an inductive element with a magnetic core.

Certain aspects of the present disclosure provide an integrated circuit package. The integrated circuit package generally includes a semiconductor die, a redistribution layer, and a magnetic core. The semiconductor die includes a metal layer having first conductive traces and conductive pillars coupled to and extending from the metal layer. The redistribution layer is disposed below the semiconductor die and includes second conductive traces. A portion of the first conductive traces, a portion of the conductive pillars, and a portion of the second conductive traces are arranged to form an inductive element disposed below a portion of the semiconductor die. The magnetic core is disposed in the inductive element.

Certain aspects of the present disclosure provide a method of fabricating an integrated circuit package. The method generally includes forming a semiconductor die comprising a metal layer having first conductive traces and conductive pillars coupled to and extending from the metal layer. The method also includes forming a redistribution layer disposed above the semiconductor die and comprising second conductive traces, wherein forming the redistribution layer comprises forming an inductive element from a portion of the first conductive traces, a portion of the conductive pillars, and a portion of the second conductive traces. The method further includes forming a magnetic core in the inductive element.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure relate to an integrated circuit package having an inductive element with a magnetic core and a method of fabricating such an integrated circuit package.

A wireless communication device may include a transceiver (e.g., a radio frequency front-end (RFFE) circuit or RF transceiver circuit) for transmitting and/or receiving RF signals. The RF transceiver circuit may include a switched-mode power supply (SMPS) to provide a variable supply voltage (e.g., VDD) to a power amplifier (PA) for efficient power consumption. Typically, a low pass filter implemented with an inductor-capacitor (LC) circuit is coupled to the output of the SMPS in order to prevent or reduce the effect of high frequency noise or harmonics from the SMPS on the PA. In certain cases, the inductance of the inductor in the LC circuit may be greater than 0.5 µH. With such a large inductance, the inductor may be implemented as a relatively large surface mount inductor integrated onto a substrate of a system-in-package (SIP) and laterally adjacent to the SMPS die.

Certain aspects of the present disclosure relate to integrating an inductive element into an IC package, such as the SMPS die package for an RF transceiver circuit. In certain cases, as the switching frequency of the SMPS voltage regulators is at or above a certain frequency (e.g., ≥30 MHz) for efficient transmission of RF signals, for example, in the millimeter wave bands of 5G NR (e.g., 24 GHz to 53 GHz), the inductance of the inductor in the LC circuit may be reduced, for example, to less than or equal to 50 nH. With such a small inductance, the size of the inductor may also be reduced, which may enable the inductor to be integrated within an IC package, such as the IC package of the power supply circuit. The integration of the inductor into IC package as further described herein may enable improved power conversion efficiency, IC package size reduction, and cost reduction in fabricating the IC package.

Figure 1:
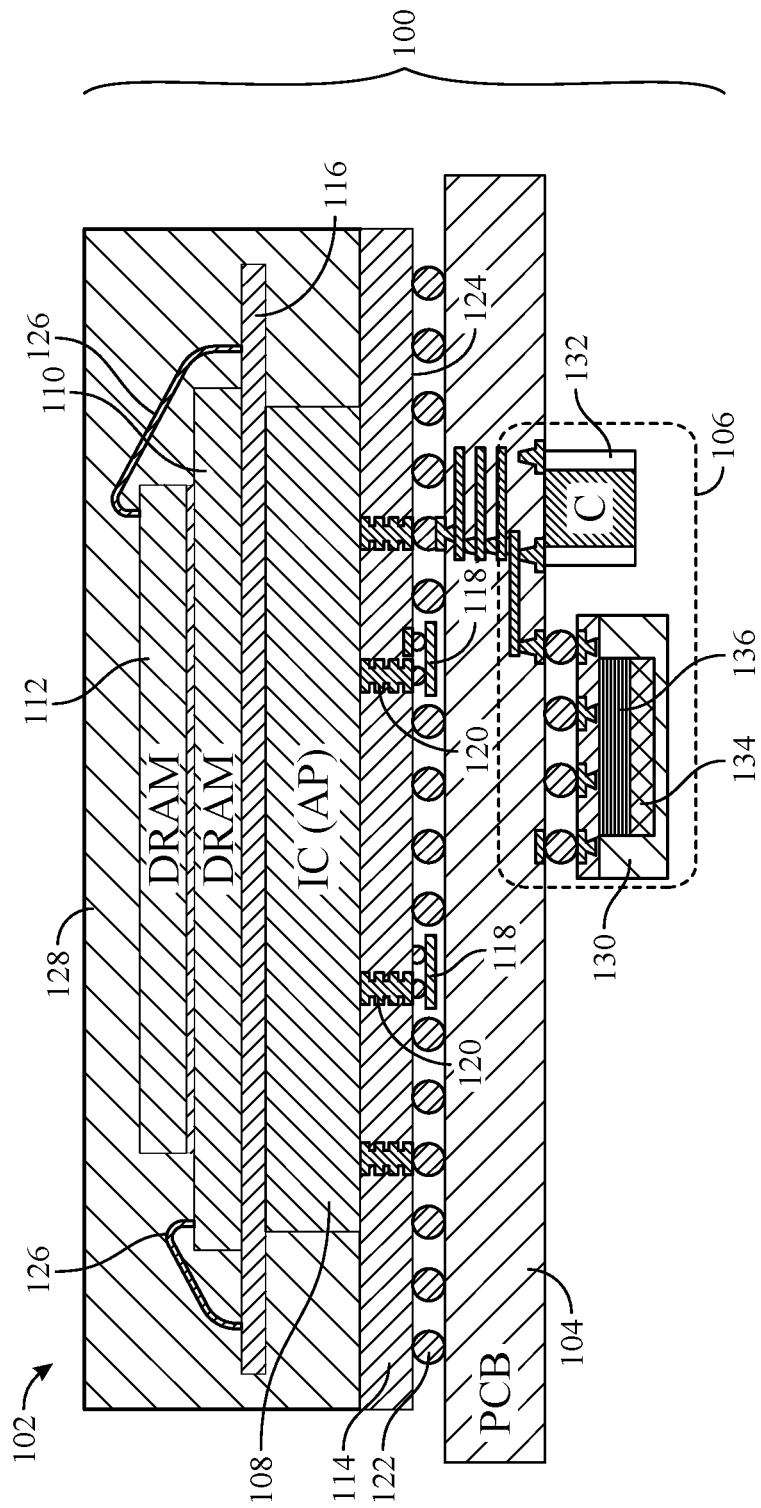
FIG. 1 illustrates a cross-sectional view of an example electronic device having an integrated circuit (IC) package with an inductive element mounted on a printed circuit board (PCB), in accordance with certain aspects of the present disclosure.

In certain aspects, an electronic device (e.g., the RF transceiver circuit and/or a system-on-a-chip (SoC) of a wireless communication device) may have an IC package (e.g., portion of a power supply circuit) with an inductive element integrated between a semiconductor die and redistribution layer as further described herein. For example, FIG. 1 is a cross-sectional view of an example electronic device 100 having an IC package with an inductive element, in accordance with certain aspects of the present disclosure. As shown, the electronic device 100 may include a chip assembly 102, a circuit board 104, and a power supply circuit 106.

The chip assembly 102 may be coupled to the circuit board 104. The chip assembly 102 may include a first integrated circuit die 108 (also referred to as the first die), one or more second integrated circuit die(s) 110, 112 (also referred to as the second dies), redistribution layers 114, interposer layers 116, and one or more capacitive elements 118. The chip assembly 102 may be, for example, a fan-out wafer-level package-on-package assembly.

The first die 108 may be, for example, a processor such as the processor of a system-on-a-chip (SoC). In aspects, the first die 108 may include a processor, a graphics processing unit (GPU), a digital signal processor (DSP), an application specific integrated circuit (ASIC), a field programmable gate array (FPGA) or other programmable logic device (PLD), discrete gate or transistor logic, or any combination thereof. The first die 108 is disposed between the redistribution layers 114 and the interposer layers 116.

The redistribution layers 114 may provide access to the input/output (I/O) of the first die 108. The redistribution layers 114 may include electrical routing 120, such as conductive traces and vias, embedded in the redistribution layers 114. Solder bumps 122 may be disposed below the redistribution layers 114 and electrically coupled to the I/O pins of the first die 108 through the electrical routing 120 of the redistribution layers 114. The solder bumps 122 may enable the chip assembly 102 to be mounted and electrically coupled to external circuitry, such as the circuit board 104, motherboard, or another chip or wafer. The solder bumps 122 may form a solder ball grid array with the capacitive elements 118 disposed adjacent to a portion of the solder bumps 122.

In certain aspects, as illustrated in FIG. 1, the capacitive elements 118 may be coupled to a land-side surface 124 of the redistribution layers 114. In other words, the capacitive elements 118 are disposed on a land-side of an IC package (e.g., the chip assembly 102) between electrical contacts (e.g., the solder bumps 122) extending from a surface (the land-side surface 124) of the IC package. For example, the capacitive elements 118 may serve as decoupling capacitors for the circuitry of the first die 108 and/or second dies 110, 112.

The interposer layers 116 are disposed between the first die 108 and the second dies 110, 112. The interposer layers 116 include electrical routing that provides access to the I/O pins of the second dies 110, 112. For example, the first die 108 may be electrically coupled to the second dies 110, 112 through the interposer layers 116.

The second dies 110, 112 are disposed above the interposer layer 116. In certain cases, the second dies 110, 112 include memory chips (e.g., dynamic random access memory (DRAM) chips) that are electrically coupled to the first die 108. In aspects, conductive wiring 126 (e.g., wire bonding) may be electrically coupled to the second dies 110, 112 and the interposer layers 116. The conductive wiring 126 may provide access to the frontside of the second dies 110, 112.

In certain aspects, a molding compound 128 may be disposed above the redistribution layers 114 and surround the first die 108, the interposer layers 116, and the second dies 110, 112. The molding compound 128 may serve as a structural support that encapsulates the first die 108, the interposer layers 116, and the second dies 110, 112. In aspects, the molding compound 128 may also prevent or at least reduce physical damage and corrosion of the electrical components of the chip assembly 102.

The circuit board 104 may be a printed circuit board, motherboard, or any suitable carrier for electronic circuits such as the chip assembly 102 and power supply circuit 106.

The power supply circuit 106 may be a switched-mode power supply circuit that provides a variable supply voltage to the chip assembly 102 through the circuit board 104. The power supply circuit 106 includes an IC package 130 and a capacitive element 132. The IC package 130 may be electrically coupled to the capacitive element 132 through the circuit board 104. The IC package 130 includes a semiconductor die 134 and an inductive element 136. In aspects, the semiconductor die 134 may include a switched-mode power supply and/or a power management circuit. In aspects, the inductive element 136 may be integrated in the IC package 130 as further described herein with respect to FIGS. 3A, 3B, 4, and 5. The inductive element 136 may be electrically coupled in series between the semiconductor die 134 and the capacitive element 132 as further described herein with respect to FIG. 2. The capacitive element 132 may be a surface mount capacitor coupled to the circuit board 104. In aspects, the capacitive element 132 may include a metal-insulator-metal (MIM) capacitor, metal-oxide-metal (MOM) capacitor, a metal-oxide-semiconductor (MOS) capacitor, a metal fringe capacitor, a trench capacitor, a junction capacitance of a diode or transistor, or the like. The capacitive element 132 and the inductive element 136 may be configured as an LC resonant circuit having a passband (or resonant frequency range) within a certain frequency range of the variable supply voltage of the power supply circuit 106.

Example RF Transceiver

Figure 2:
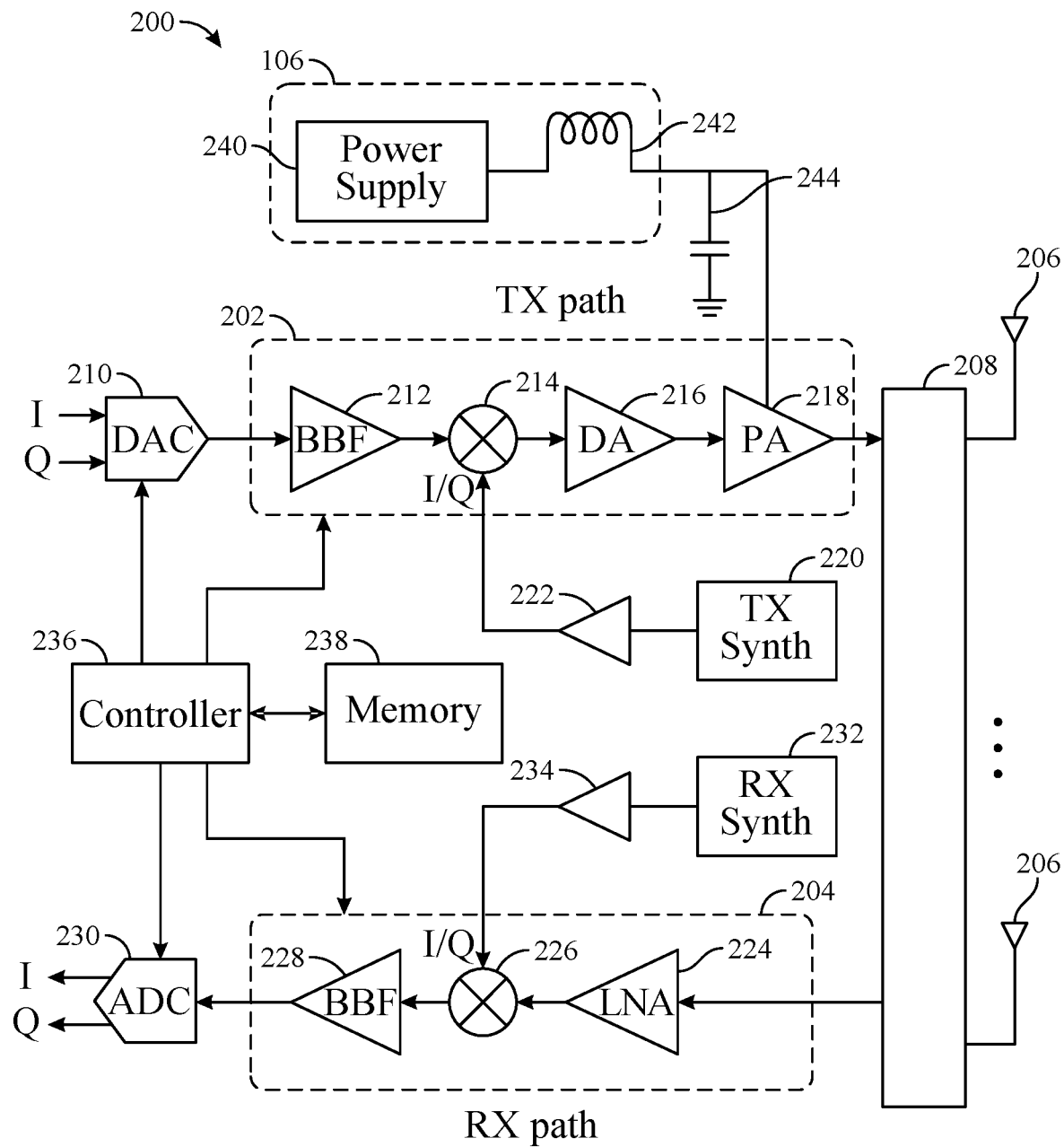
FIG. 2 is a block diagram of an example radio frequency transceiver, in accordance with certain aspects of the present disclosure.

FIG. 2 is a block diagram of an example RF transceiver circuit 200, in accordance with certain aspects of the present disclosure. In certain aspects, the RF transceiver circuit 200 may be implemented as a portion of the chip assembly 102.

The RF transceiver circuit 200 includes at least one transmit (TX) path 202 (also known as a transmit chain) for transmitting signals via one or more antennas 206 and at least one receive (RX) path 204 (also known as a receive chain) for receiving signals via the antennas 206. When the TX path 202 and the RX path 204 share an antenna 206, the paths may be connected with the antenna via an interface 208, which may include any of various suitable RF devices, such as a switch, a duplexer, a diplexer, a multiplexer, and the like.

Receiving in-phase (I) or quadrature (Q) baseband analog signals from a digital-to-analog converter (DAC) 210, the TX path 202 may include a baseband filter (BBF) 212, a mixer 214, a driver amplifier (DA) 216, and a power amplifier (PA) 218. The BBF 212, the mixer 214, the DA 216, and the PA 218 may be included in a radio frequency integrated circuit (RFIC).

In aspects, a power supply 240 may provide a variable supply voltage to the PA 218 to facilitate efficient operation of the PA 218 in terms of power consumption. The supply voltage may be adjusted using various techniques including APT, CET, and/or DET. An LC resonant circuit including an inductive element 242 and a capacitive element 244 may be coupled between the output of the power supply 240 and the power rail of the PA 218. In aspects, the power supply 240 and inductive element 242 may be implemented as the IC package 130 of FIG. 1.

The BBF 212 filters the baseband signals received from the DAC 210, and the mixer 214 mixes the filtered baseband signals with a transmit local oscillator (LO) signal to convert the baseband signal of interest to a different frequency (e.g., upconvert from baseband to a radio frequency). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 214 are typically RF signals, which may be amplified by the DA 216 and/or by the PA 218 before transmission by the antenna 206.

The RX path 204 may include a low noise amplifier (LNA) 224, a mixer 226, and a baseband filter (BBF) 228. The LNA 224, the mixer 226, and the BBF 228 may be included in a RFIC, which may or may not be the same RFIC that includes the TX path components. RF signals received via the antenna 206 may be amplified by the LNA 224, and the mixer 226 mixes the amplified RF signals with a receive local oscillator (LO) signal to convert the RF signal of interest to a different baseband frequency (e.g., downconvert). The baseband signals output by the mixer 226 may be filtered by the BBF 228 before being converted by an analog-to-digital converter (ADC) 230 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 220, which may be buffered or amplified by amplifier 222 before being mixed with the baseband signals in the mixer 214. Similarly, the receive LO may be produced by an RX frequency synthesizer 232, which may be buffered or amplified by amplifier 234 before being mixed with the RF signals in the mixer 226. For certain aspects, a single frequency synthesizer may be used for both the TX path 202 and the RX path 204.

In aspects, the TX frequency synthesizer 220 and/or RX frequency synthesizer 232 may include a frequency multiplier, such as a frequency doubler, that is driven by an oscillator (e.g., a VCO) in the frequency synthesizer.

A controller 236 may direct the operation of the RF transceiver circuit 200, such as transmitting signals via the TX path 202 and/or receiving signals via the RX path 204. The controller 236 may be a processor, a digital signal processor (DSP), an application specific integrated circuit (ASIC), a field programmable gate array (FPGA) or other programmable logic device (PLD), discrete gate or transistor logic, discrete hardware components, or any combination thereof. The memory 238 may store data and program codes for operating the RF transceiver circuit 200. The controller 236 and/or memory 238 may include control logic (e.g., CMOS logic).

While FIG. 2 provides an RF transceiver as an example application in which certain aspects of the present disclosure may be implemented to facilitate understanding, certain aspects described herein related to an IC package having an inductive element with a magnetic core may be utilized in various other suitable electronic systems.

Example Integrated Circuit Package

Figure 3A:
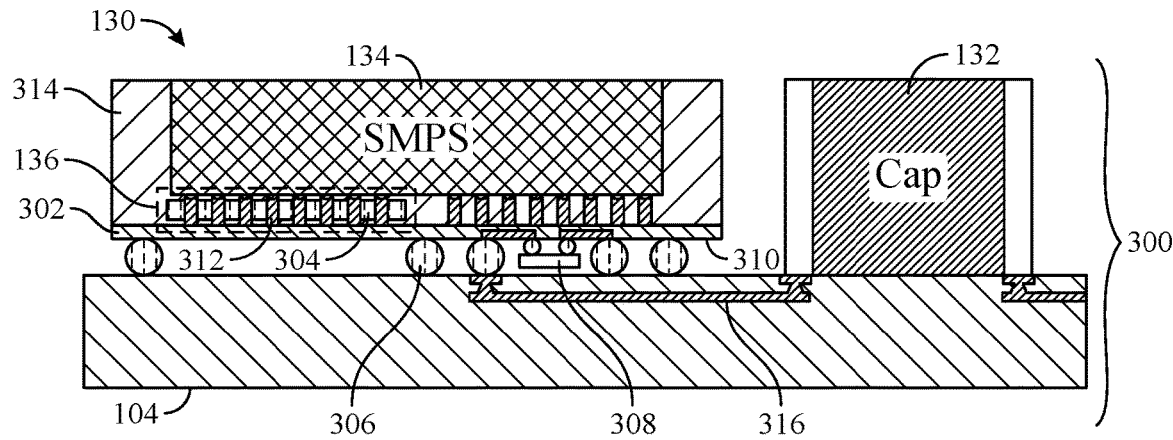
FIG. 3A illustrates a cross-sectional view of an example power supply circuit having an IC package with an inductive element, in accordance with certain aspects of the present disclosure.

FIG. 3A illustrates a cross-sectional view of an example power supply circuit 300 having an IC package with an inductive element, in accordance with certain aspects of the present disclosure. As shown, the power supply circuit 300 may include the circuit board 104, the IC package 130, and the capacitive element 132.

In aspects, the IC package 130 may be a fan-out wafer level package. The IC package 130 includes the semiconductor die 134, the inductive element 136, a redistribution layer 302, a magnetic core 304, and conductive bumps 306. In certain aspects, the IC package 130 may also include capacitive elements 308 coupled to a land-side surface 310 of the IC package 130.

Figure 4:
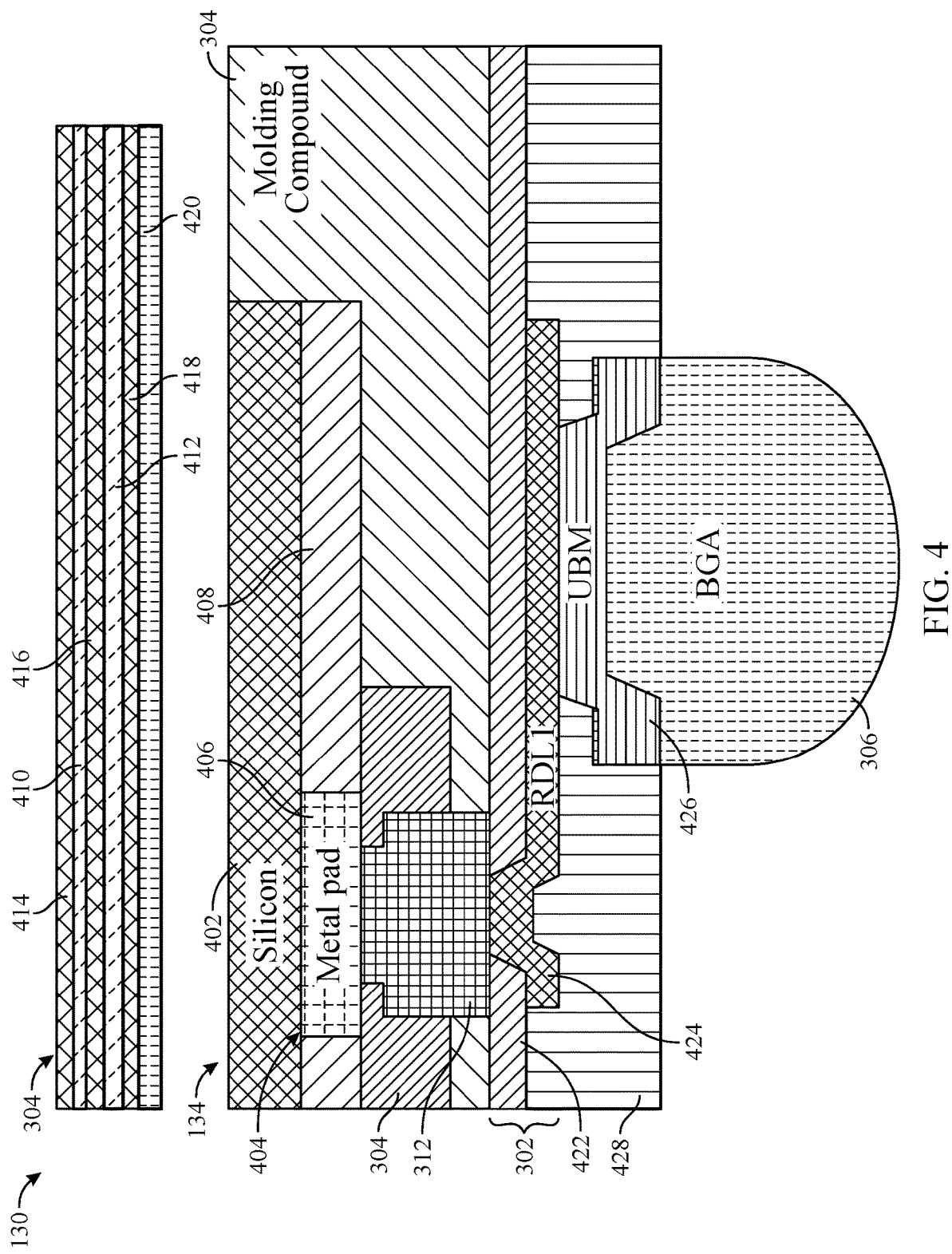
FIG. 4 illustrates a cross-sectional view of a portion of the IC package depicted in FIG. 3A, in accordance with certain aspects of the present disclosure.

The semiconductor die 134 may include conductive pillars 312 coupled to and extending from a metal layer (not shown) embedded in the semiconductor die 134 as further described herein with respect to FIG. 4. The conductive pillars 312 are also coupled to the redistribution layer 302. A portion of the conductive pillars 312 along with conductive traces (not shown) of the semiconductor die 134 and the redistribution layer 302 may be arranged to form the inductive element 136 as further described herein with respect to FIG. 4. For example, the conductive coils of the inductive element 136 may be formed at least in part from the portion of the conductive pillars 312. The conductive pillars 312 may be, for example, copper (Cu) pillars. In certain aspects, the conductive pillars 312 may include an electrically conductive material having various metal alloys or metals such as aluminum (Al), chromium (Cr), cobalt (Co), copper (Cu), tantalum (Ta), titanium (Ti), tungsten (W), etc. The other portion of the conductive pillars 312 may provide electrical access to various circuits (e.g., a voltage regulator, a buck converter, an envelope tracking circuit, an average power tracking circuit, etc.) embedded in the semiconductor die 134.

The redistribution layer 302 may provide access to the I/O pins (e.g., the conductive pillars 312) of the semiconductor die 134, as further described herein with respect to FIG. 4.

The magnetic core 304 may include a ferromagnetic material, for example. In certain aspects, the magnetic core 304 may include at least one magnetic film and at least one dielectric layer (not shown), as further described herein with respect to FIG. 4. The magnetic core 304 may be disposed in the magnetic coils of the inductive element 136. That is, the magnetic core 304 may be surrounded by the conductive coils of the inductive element 136. The magnetic core 304 may serve to increase the inductance of the inductive element 136. In aspects, the magnetic permeability of the magnetic core 304 may be adjusted to obtain a certain inductance of the inductive element 136. In certain cases, the inductive element 136 may have various core materials, such as a ceramic, dielectric, or molding compound, without a magnetic material.

The conductive bumps 306 may be solder bumps or additional conductive pillars extending from the land-side surface 310 of the IC package 130. The conductive bumps 306 may form a solder ball grid array, which is coupled to the circuit board 104.

Figure 3B:
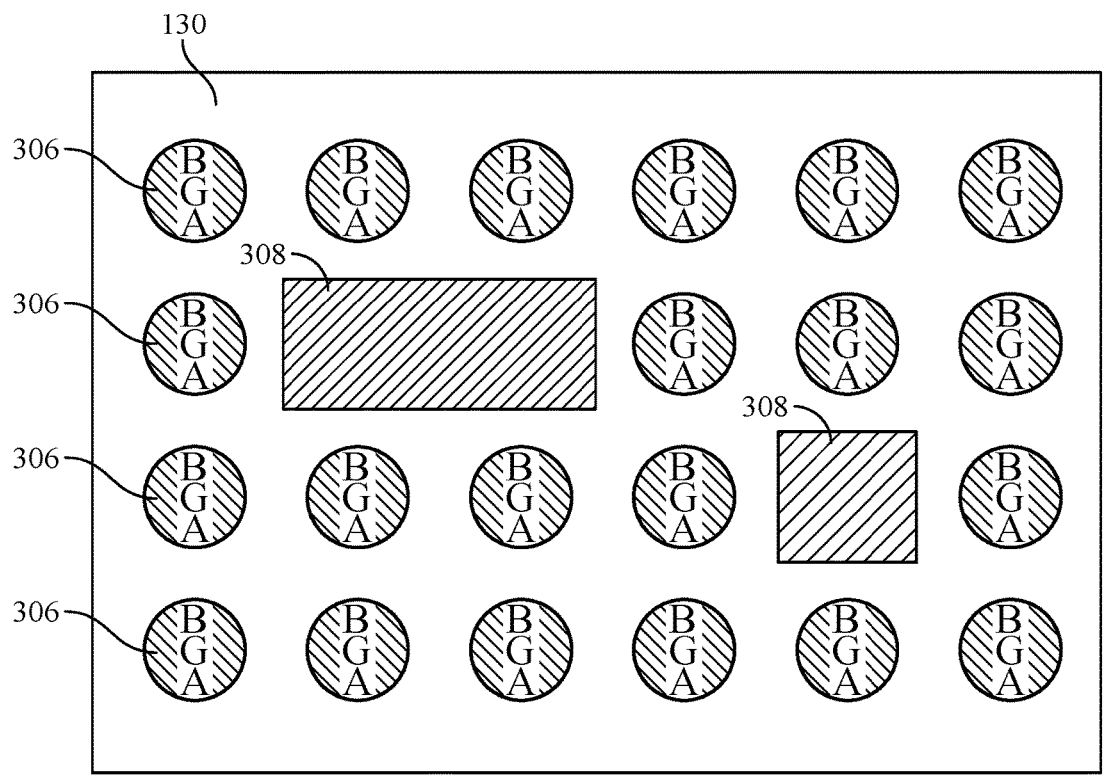
FIG. 3B illustrates a bottom view of the IC package of FIG. 3A, in accordance with certain aspects of the present disclosure.

The capacitive elements 308 may be coupled to the land-side surface 310 and disposed adjacent to a portion of the conductive bumps 306 for example, as depicted in FIG. 3B illustrating a bottom view of the IC package 130. The capacitive elements 308 may serve as decoupling capacitors for the circuitry of the semiconductor die 134. In aspects, the capacitive elements 308 may improve the power conversion efficiency of the power supply circuit 300 and reduce the impedance of the power supply circuit 300 by providing a local charge reservoir for the IC package 130. In certain aspects, the capacitive elements 308 may be coupled in parallel with the capacitive element 132 through conductive wiring 316 embedded in the circuit board 104.

In certain aspects, a molding compound 314 may be disposed above the redistribution layer 302 and surround the semiconductor die 134. In aspects, the molding compound may be disposed between the semiconductor die 134 and the redistribution layer 302. The molding compound 314 may serve as a structural support that encapsulates the semiconductor die 134 and a portion of the inductive element 136. For example, the molding compound 314 may hold the magnetic core 304 in place between the semiconductor die 134 and the redistribution layer 302. That is, the magnetic core 304 may be embedded in the molding compound 314. In aspects, the molding compound 314 may also prevent or at least reduce physical damage and corrosion of the electrical components of the IC package 130.

FIG. 4 illustrates a cross-sectional view of a portion of the IC package 130 depicted in FIG. 3A, in accordance with certain aspects of the present disclosure. As shown, the IC package 130 includes the semiconductor die 134, the magnetic core 304, the redistribution layer 302, and the conductive bumps 306.

The semiconductor die 134 may include dielectric layers 402, a metal layer 404, a first passivation layer 408, and the conductive pillars 312. The dielectric layers 402 may have various metal layers and/or electrical components embedded in the dielectric layers 402. In aspects, the dielectric layers may include a portion of a semiconductor wafer on which various semiconductor devices are formed, for example, during front-end-of-line (FEOL) fabrication processes, when electrical devices (e.g., transistors and capacitive elements), terminals therefor, and local interconnects are patterned on a substrate. In certain aspects, the dielectric layers 402 may be formed during a back-end-of-line (BEOL) fabrication process, when the electrical devices are electrically interconnected via the metal layers.

The metal layer 404 may include various electrically conductive traces and pads disposed below the dielectric layers 402. For example, the metal layer 404 may have first conductive traces 406, where a portion of the first conductive traces 406 may form a portion of the inductive element 136 as further described herein with respect to FIG. 5. In certain aspects, a portion of the metal layer 404 may be embedded in the dielectric layers 402 and have an exposed surface for coupling to the conductive pillars 312. The first passivation layer 408 may be disposed below the dielectric layers 402 and adjacent to the metal layer 404. The first passivation layer 408 may be a solder mask layer including polyimide, silicon dioxide ($SiO_2$), or silicon nitride ($Si_3N_4$).

The magnetic core 304 includes at least one dielectric layer 410, 412 and at least one layer of magnetic film 414, 416, 418. The layers of magnetic film 414, 416, 418 may include at least one of a ferromagnetic alloy, a cobalt-tantalum-zirconium (CoTaZr) alloy, a cobalt-iron (CoFe) alloy, or a nickel-iron (NiFe) alloy. The dielectric layers 410, 412 may include a dielectric material such as silicon dioxide, silicon nitride, or other suitable electrical insulating materials. In aspects, the magnetic core 304 may also include a planarization layer 420. The planarization layer 420 may be a plastic polymer or other matrix material such as an epoxy resin. The planarization layer 420 may serve as a substrate on which the magnetic core 304 is formed.

The redistribution layer 302 is disposed below the semiconductor die 134 and may include one or more dielectric layers 422 and second conductive traces 424. In certain cases, the redistribution layer 302 may have a larger area than the semiconductor die 134 to facilitate the fanning out of conductive traces to the conductive bumps 306. The second conductive traces 424 may be electrically coupled to the first conductive traces 406 through the conductive pillars 312. A portion of the second conductive traces 424 may form a portion of the inductive element 136 as further described herein with respect to FIG. 5. In aspects, the redistribution layer 302 may include multiple layers of conductive traces that facilitate the electrical routing (e.g., fan-out) of the I/O pins of the semiconductor die 134 to the conductive bumps 306.

Conductive contacts 426 (e.g., under-bump metallization) may be disposed below the redistribution layer 302. The conductive contacts 426 may be electrically coupled to the second conductive traces 424 and the conductive bumps 306. A second passivation layer 428 may be disposed below the redistribution layer 302 and adjacent to the conductive contacts 426. In aspects, the second passivation layer 428 may be a solder mask layer.

Figure 5:
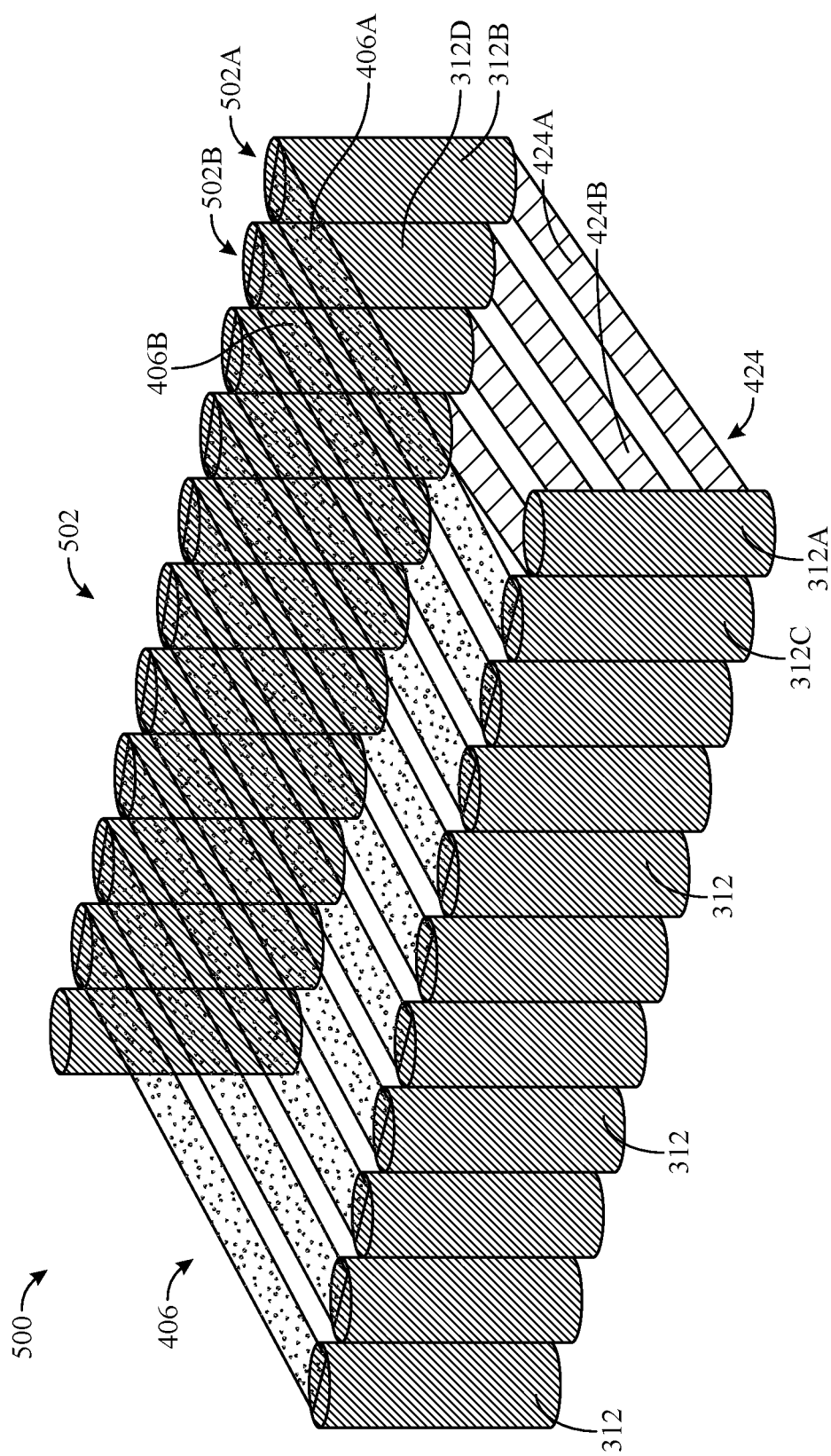
FIG. 5 illustrates an isometric view of example coils of an inductive element, in accordance with certain aspects of the present application.

FIG. 5 illustrates an isometric view of example coils of an inductive element 500, in accordance with certain aspects of the present application. As shown, the inductive element 500 has a plurality of conductive coils 502 formed from a portion of the first conductive traces 406, a portion of the conductive pillars 312, and a portion of the second conductive traces 424. For example, a first conductive coil 502A of the conductive coils 502 comprises a first conductive pillar 312A of the portion of the conductive pillars 312, a second conductive pillar 312B of the portion of the conductive pillars 312, a first conductive trace 406A of the portion of the first conductive traces 406 electrically coupled to the second conductive pillar 312B, and a second conductive trace 424A of the portion of the second conductive traces 424 electrically coupled to the first and second conductive pillars 312A, 312B. The first conductive pillar 312A is laterally spaced from the second conductive pillar 312B.

In aspects, the conductive coils 502 may also include a second conductive coil 502B coupled to and disposed adjacent to the first conductive coil 502A. The second conductive coil 502B may include a third conductive pillar 312C of the portion of the conductive pillars 312, a fourth conductive pillar 312D of the portion of the conductive pillars 312, a third conductive trace 406B of the portion of the first conductive traces 406 electrically coupled to the fourth conductive pillar 312D, and a fourth conductive trace 424B of the portion of the second conductive traces 424 electrically coupled to the third and fourth conductive pillars 312C, 312D. In aspects, the third conductive pillar is electrically coupled to the first conductive trace 406A. In certain aspects, at least some of the conductive coils 502 may surround the magnetic core (not shown) of FIG. 4.

In certain aspects, the IC package may be fabricated using a fan-out wafer level packaging process. FIGS. 6A-6D illustrate example operations for fabricating an integrated circuit package, in accordance with certain aspects of the present disclosure. The operations may be performed by a semiconductor fabrication facility, for example.

Figure 6A:
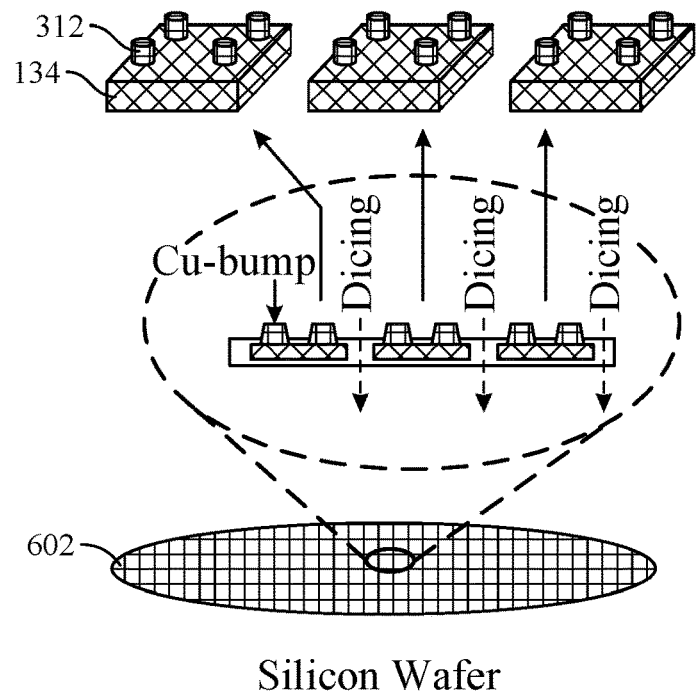
FIGS. 6A-6D illustrate example operations for fabricating an integrated circuit package, in accordance with certain aspects of the present disclosure.

As shown in FIG. 6A, the semiconductor die 134 may be formed on a first substrate 602, for example, a semiconductor wafer or substrate. In certain cases, a boule of a semiconductor (e.g., silicon) may be formed and sliced into individual wafers, which may serve as the substrate material for forming the semiconductor die 134. In certain cases, a plurality of semiconductor dies 134 may be formed on the first substrate 602 and diced into individual semiconductor dies 134. The conductive pillars 312 may also be formed extending from the metal layer (not shown) of the semiconductor die 134.

Figure 6B:
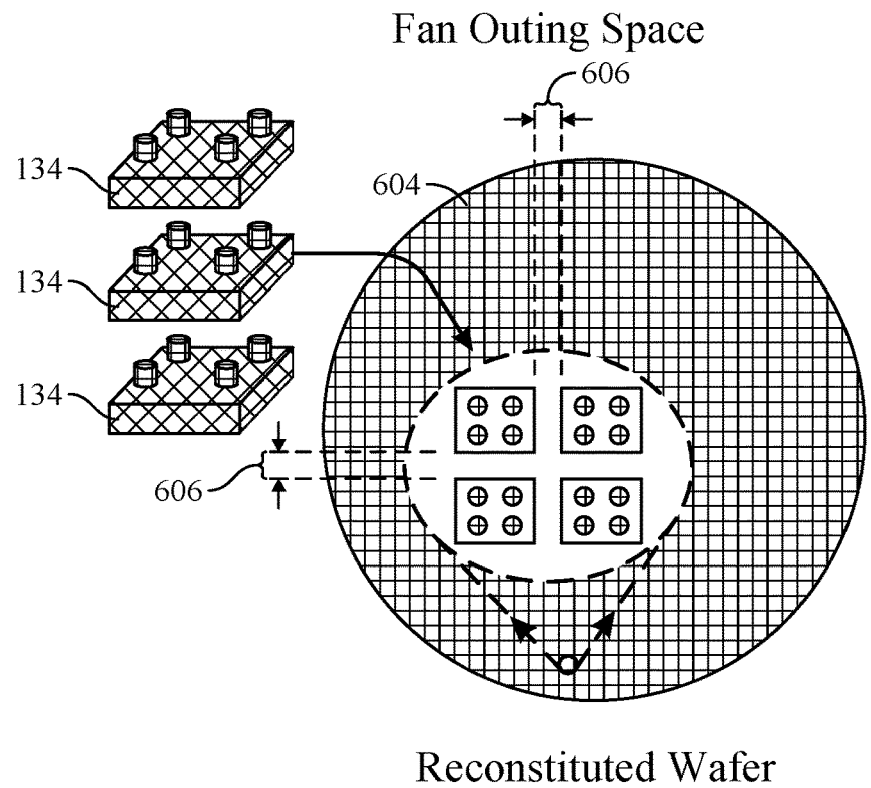

Referring to FIG. 6B, the individual semiconductor dies 134 may be disposed on a second substrate 604 (e.g., to form a reconstituted wafer) with the conductive pillars 312 facing up. That is, the semiconductor dies 134 may be placed on the second substrate 604 die side up. The semiconductor dies 134 may be spaced on the second substrate 604 with enough fan-out spacing 606 between each semiconductor die 134 to facilitate the formation of the redistribution layer(s) for each of the semiconductor dies 134. In certain aspects, the second substrate 604 may be a semiconductor wafer, glass wafer, dielectric wafer, a polymer or other matrix material (e.g., an epoxy resin), or any combination thereof.

Figure 6C:
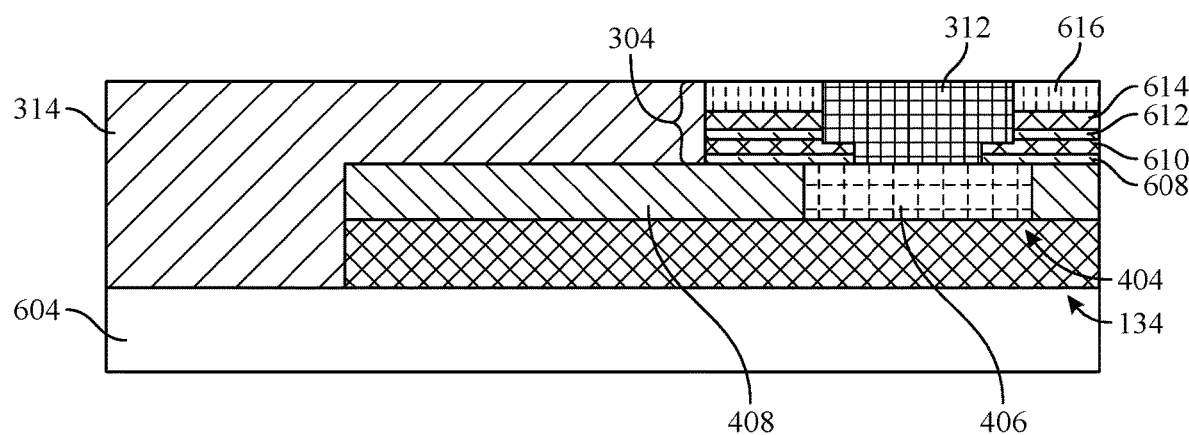

As illustrated in FIG. 6C, the magnetic core 304 may be formed above the metal layer 404 and between the portion of the conductive pillars 312, which form the inductive element 136. In certain aspects, the magnetic core 304 may be formed on a separate substrate (e.g., the planarization layer), planarized, and disposed above the metal layer 404 and between the portion of the conductive pillars 312. As an example, a first dielectric layer 608 may be formed above the metal layer 404, a first magnetic film 610 may be formed above the first dielectric layer 608, a second dielectric layer 612 may be formed above the first magnetic film 610, a second magnetic film 614 may be formed above the second dielectric layer 612, and a planarization layer 616 may be formed above the second magnetic film 614.

After formation or disposition of the magnetic core 304, the molding compound 314 may be formed above the second substrate 604, such that the molding compound 314 encapsulates the semiconductor die 134 and magnetic core 304. A planarization process (e.g., a chemical mechanical planarization (CMP) process) may be performed to smooth and remove a portion of the molding compound 314, which may extend above the conductive pillars 312 (not shown). In certain aspects, the planarization process may remove a portion of the conductive pillars 312 and/or a portion of the planarization layer 616. The planarization process may expose a surface of the conductive pillars 312 for electrically coupling to the conductive traces of a redistribution layer. In certain cases, the height of the magnetic core 304 may span the height of the conductive pillars 312. In other cases, the height of the magnetic core 304 may be span a portion of the conductive pillars 312.

Figure 6D:
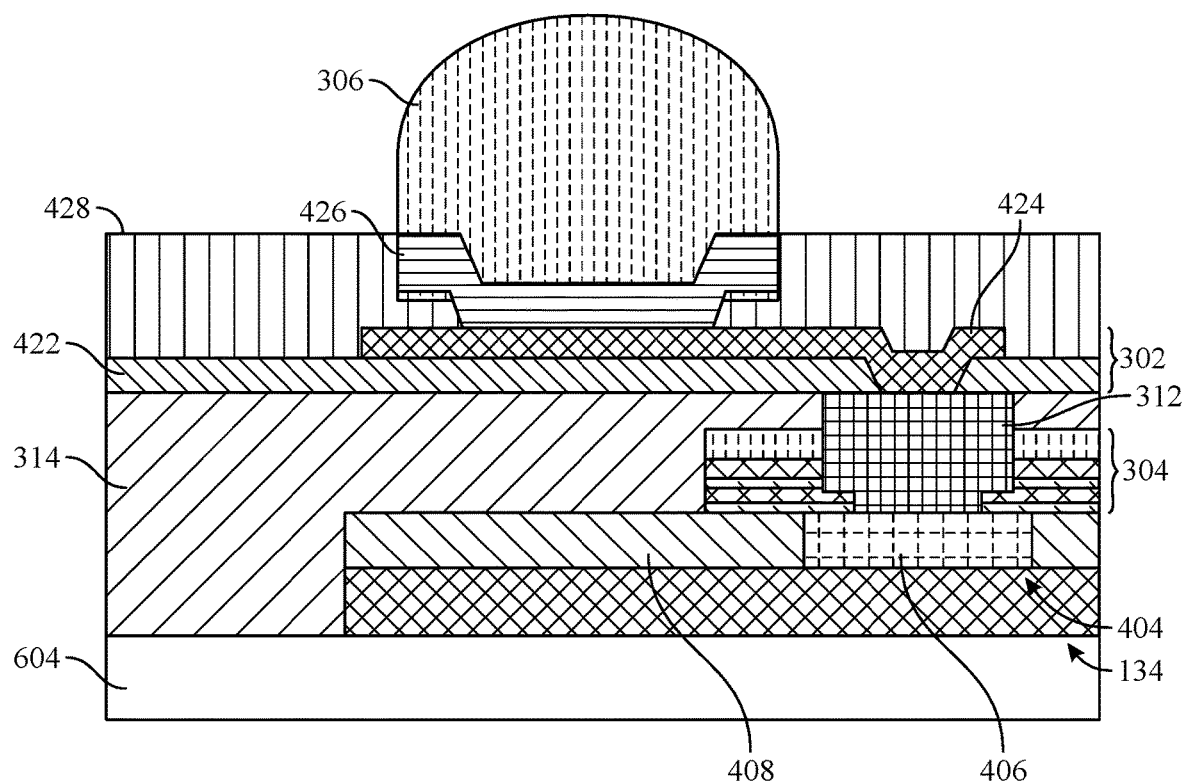

Referring to FIG. 6D, the redistribution layer 302 may be formed above the molding compound 314. For example, the dielectric layer 422 may be formed above the molding compound 314. Cavities that expose the conductive pillars 312 may be patterned in the dielectric layer 422. The second conductive traces 424 may be formed above the dielectric layer 422 and in the cavities in the dielectric layer 422 such that the second conductive traces 424 are electrically coupled to the conductive pillars 312. The conductive contacts 426 may be formed above and coupled to the second conductive traces 424. The conductive bumps 306 may be formed above and coupled to the conductive contacts 426.

While the fabrication process depicted in FIGS. 6A-6D provides an example chip-first die-side up process flow to facilitate understanding, the IC package described herein may also be fabricated using variations in the chip-first die-side up process flow and/or a chip-first die-side down process flow. For example, in certain cases, the conductive pillars may be formed after the semiconductor die is disposed on the second substrate.

In a die-side down process flow, the redistribution layer may be formed above the second substrate, the magnetic core may be formed above the redistribution layer, and the semiconductor die may be flip-chip disposed above the redistribution layer. Then, the molding compound may be applied to encapsulate the semiconductor die above the redistribution layer.

As another example of a die-side down process flow, the magnetic core may be formed or disposed on the second substrate, and the semiconductor die may be flip-chip disposed above the second substrate. The molding compound may be applied to encapsulate the semiconductor die and magnetic core. Then, the second substrate may be inverted and planarized away to reveal the conductive pillars of the semiconductor die, and the redistribution layer may be formed above the molding compound as described herein with respect to FIG. 6D.

Figure 7:
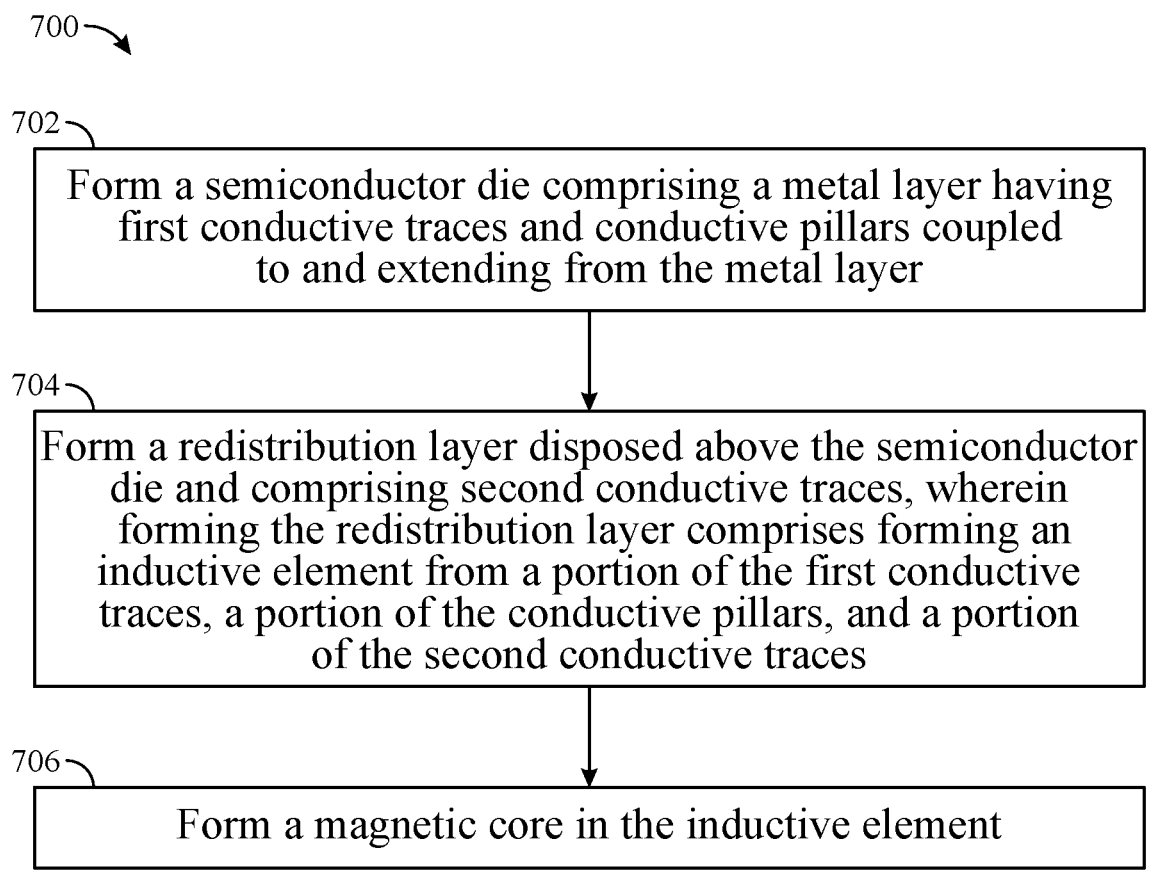
FIG. 7 is a flow diagram of example operations for fabricating an IC package having an inductive element, in accordance with certain aspects of the present disclosure.

FIG. 7 is a flow diagram of example operations 700 for fabricating an integrated circuit package (e.g., the IC package 130), in accordance with certain aspects of the present disclosure. The operations 700 may be performed by a semiconductor fabrication facility, for example.

The operations 700 may begin at block 702, by forming a semiconductor die (e.g., the semiconductor die 134) comprising a metal layer (e.g., the metal layer 404) having first conductive traces (e.g., the first conductive traces 406) and conductive pillars (e.g., the conductive pillars 312) coupled to and extending from the metal layer. At block 704, a redistribution layer (e.g., the redistribution layer 302) may be formed above the semiconductor die and comprising second conductive traces. In aspects, forming the redistribution layer at block 704 may also include forming an inductive element (e.g., the inductive element 136) from a portion of the first conductive traces, a portion of the conductive pillars, and a portion of the second conductive traces. At block 706, a magnetic core (e.g., the magnetic core 304) may be formed in the inductive element.

In aspects, forming the inductive element at block 704 may include forming conductive coils (e.g., the conductive coils 502) from the portion of the first conductive traces, the portion of the conductive pillars, and the portion of the second conductive traces. In aspects, the conductive coils include a conductive coil formed by a first conductive pillar of the portion of the conductive pillars, a second conductive pillar of the portion of the conductive pillars, a first conductive trace of the first conductive traces electrically coupled to the second conductive pillar, and a second conductive traces of the second conductive traces electrically coupled to the first and second conductive pillars.

In aspects, forming the magnetic core at block 706 comprises forming the magnetic core between a first set of the portion of the conductive pillars (e.g., the conductive pillars 312A, 312C) and a second set of the portion of the conductive pillars (e.g., the conductive pillars 312B, 312D). In certain aspects, forming the magnetic core at block 706 may include forming a dielectric layer (e.g., the first dielectric layer 608) and forming a magnetic film (e.g., the first magnetic film 610) above the dielectric layer. The magnetic film of the magnetic core may include at least one of a ferromagnetic alloy, a cobalt-tantalum-zirconium (CoTaZr) alloy, a cobalt-iron (CoFe) alloy, or a nickel-iron (NiFe) alloy. The dielectric layer of the magnetic core may include silicon dioxide ($SiO_2$). In aspects, forming the magnetic core at block 704 may be performed before forming the redistribution layer, for example, as described herein with respect to FIG. 6C.

The operations 700 may further include forming a molding material (e.g., the molding compound 314) between the semiconductor die and the redistribution layer. In aspects, the molding compound may encapsulate the semiconductor die and the magnetic core.

The operations 700 may further include comprising forming conductive contacts (e.g., the conductive contacts 426) above the redistribution layer, where the conductive contacts are electrically coupled to conductive traces (e.g., the second conductive traces) of the redistribution layer. The operations 700 may also include forming a conductive bump (e.g., the conductive bumps 306) above and electrically coupled to each of the conductive contacts.

In certain aspects, a land-side capacitor may be coupled to the IC package. For example, the operation 700 may further include coupling a capacitive element (e.g., the capacitive element 308) above the redistribution layer. In aspects, the inductive element and the capacitive element may be electrically coupled as a filter.

In certain aspects, the semiconductor die may include a portion of a switched-mode power supply circuit (e.g., the power supply 240), and the switched-mode power supply circuit may be coupled to the inductive element, for example, as depicted in FIG. 2.

In certain aspects, the IC package may be part of a power distribution network of an electronic device, such as the electronic device 100. The operations 700 may further include coupling a capacitive element (e.g., the capacitive element 132) to a carrier (e.g., the circuit board 104) and coupling a first chip package (e.g., the IC package 130), comprising the semiconductor die, the redistribution layer, and the inductive element, to the carrier. A second chip package (e.g., the chip assembly 102) may be coupled to the carrier. In aspects, the second chip package may include at least one other semiconductor die, and the semiconductor die, the inductive element, and the capacitive element of the first chip package are electrically coupled to the at least one other semiconductor die of the second chip package through the carrier. The semiconductor die may include a power supply circuit (e.g., the power supply 240), and the inductive element and the capacitive element may be electrically coupled as a filter between the power supply circuit and the at least one other semiconductor die, for example, as depicted herein with respect to FIG. 2.

In aspects, forming the redistribution layer at block 704 may include forming a fan-out wafer level package, for example, as described herein with respect to FIGS. 6A-6D. In aspects, forming the semiconductor die at block 702 may include forming the semiconductor die with a first substrate (e.g., the first substrate 602), cutting the semiconductor die from the first substrate, and coupling the semiconductor die to a second substrate (e.g., the second substrate 604). In certain aspects, forming the redistribution layer at block 704 may include forming the redistribution layer above the semiconductor die coupled to the second substrate, for example, as described herein with respect to FIG. 6D.

Based on the present disclosure, it should be appreciated that the inductive element integrated into a chip package as described herein facilitates improved power conversion efficiency (for example, due to the reduction in conductive routing between the power supply and capacitive elements), chip package size reduction, and cost reduction in fabricating the chip package. In certain cases, the inductive element may be integrated between a semiconductor die of a power supply circuit and redistribution layer in a fan-out wafer level package. As an example, such a chip package may facilitate improved power conversion efficiency for APT and/or ET applied to the power rails of a PA in an RF transceiver.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An integrated circuit (IC) package comprising:
a semiconductor die comprising a metal layer having first conductive traces and conductive pillars coupled to and extending from the metal layer;
a redistribution layer disposed below the semiconductor die and comprising second conductive traces, wherein a portion of the first conductive traces, a portion of the conductive pillars, and a portion of the second conductive traces are arranged to form a plurality of conductive coils of an inductive element disposed below a portion of the semiconductor die; and
a magnetic core disposed in the inductive element.

2. The IC package of claim 1, wherein:
a first conductive coil of the conductive coils comprises a first conductive pillar of the portion of the conductive pillars, a second conductive pillar of the portion of the conductive pillars, a first conductive trace of the portion of the first conductive traces electrically coupled to the second conductive pillar, and a second conductive trace of the portion of the second conductive traces electrically coupled to the first and second conductive pillars.

3. The IC package of claim 2, wherein:
the conductive coils comprise a second conductive coil coupled to and disposed adjacent to the first conductive coil;
the second conductive coil comprises a third conductive pillar of the portion of the conductive pillars, a fourth conductive pillar of the portion of the conductive pillars, a third conductive trace of the portion of the first conductive traces electrically coupled to the fourth conductive pillar, and a fourth conductive trace of the portion of the second conductive traces electrically coupled to the third and fourth conductive pillars; and
the third conductive pillar is electrically coupled to the second conductive trace.

4. The IC package of claim 1, wherein the magnetic core is surrounded by the conductive coils of the inductive element.

5. The IC package of claim 4, wherein the magnetic core comprises at least one magnetic film and at least one dielectric layer.

6. The IC package of claim 5, wherein the at least one magnetic film comprises at least one of a ferromagnetic alloy, a cobalt-tantalum-zirconium (CoTaZr) alloy, a cobalt-iron (CoFe) alloy, or a nickel-iron (NiFe) alloy.

7. The IC package of claim 5, wherein the at least one dielectric layer comprises silicon dioxide ($SiO_2$).

8. The IC package of claim 1, further comprising a molding material disposed between the semiconductor die and the redistribution layer.

9. The IC package of claim 1, further comprising conductive contacts disposed below the redistribution layer and electrically coupled to the redistribution layer, wherein the conductive contacts are electrically coupled to another portion of the conductive pillars through the redistribution layer.

10. The IC package of claim 9, further comprising a conductive bump disposed below and electrically coupled to each of the conductive contacts.

11. The IC package of claim 1, further comprising a capacitive element disposed below and electrically coupled to the redistribution layer.

12. The IC package of claim 11, wherein the inductive element and the capacitive element are electrically coupled as a filter.

13. The IC package of claim 1, wherein the semiconductor die comprises a portion of a switched-mode power supply circuit and wherein the switched-mode power supply circuit comprises the inductive element.

14. The IC package of claim 1, further comprising:
a carrier;
a capacitive element coupled to the carrier;
a first chip package coupled to the carrier and comprising the semiconductor die, the redistribution layer, and the inductive element; and
a second chip package coupled to the carrier and comprising at least one other semiconductor die, wherein the semiconductor die, the inductive element, and the capacitive element of the first chip package are electrically coupled to the at least one other semiconductor die of the second chip package through the carrier.

15. The IC package of claim 14, wherein:
the semiconductor die comprises a power supply circuit; and
the inductive element and the capacitive element are electrically coupled as a filter between the power supply circuit and the at least one other semiconductor die.

16. The IC package of claim 1, wherein the IC package is a fan-out wafer level package.

17. A method of fabricating an integrated circuit (IC) package, comprising:
forming a semiconductor die comprising a metal layer having first conductive traces and conductive pillars coupled to and extending from the metal layer;
forming a redistribution layer disposed above the semiconductor die and comprising second conductive traces, wherein forming the redistribution layer comprises forming a plurality of conductive coils of an inductive element from a portion of the first conductive traces, a portion of the conductive pillars, and a portion of the second conductive traces; and
forming a magnetic core in the inductive element.

18. The method of claim 17, wherein:
the conductive coils include a conductive coil formed by a first conductive pillar of the portion of the conductive pillars, a second conductive pillar of the portion of the conductive pillars, a first conductive trace of the first conductive traces electrically coupled to the second conductive pillar, and a second conductive traces of the second conductive traces electrically coupled to the first and second conductive pillars.

19. The method of claim 17, wherein forming the magnetic core comprises forming the magnetic core between a first set of the portion of the conductive pillars and a second set of the portion of the conductive pillars.

20. The method of claim 17, wherein:
- forming the semiconductor die comprises forming the semiconductor die with a first substrate, cutting the semiconductor die from the first substrate, and coupling the semiconductor die to a second substrate; and
- forming the redistribution layer comprises forming the redistribution layer above the semiconductor die coupled to the second substrate.

\* \* \* \* \*